Figure 1:
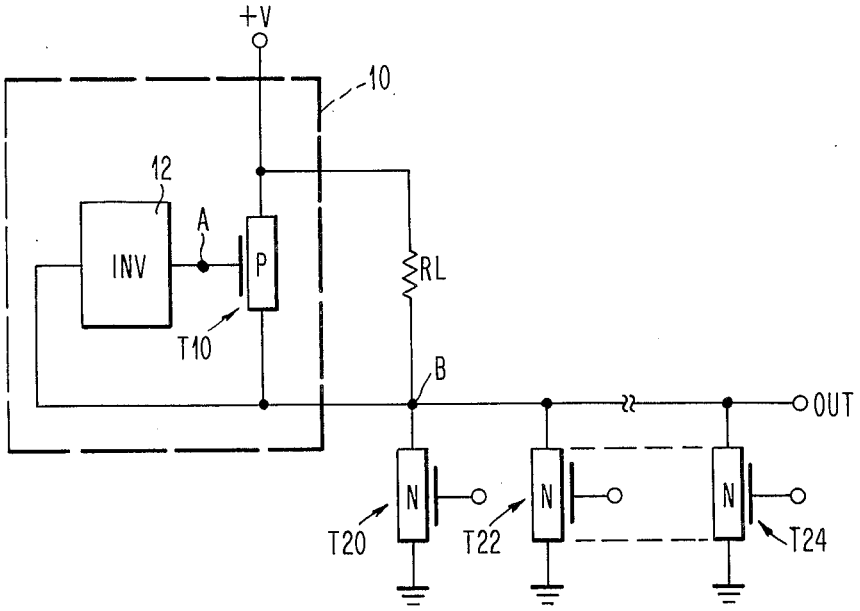
Figure 2:
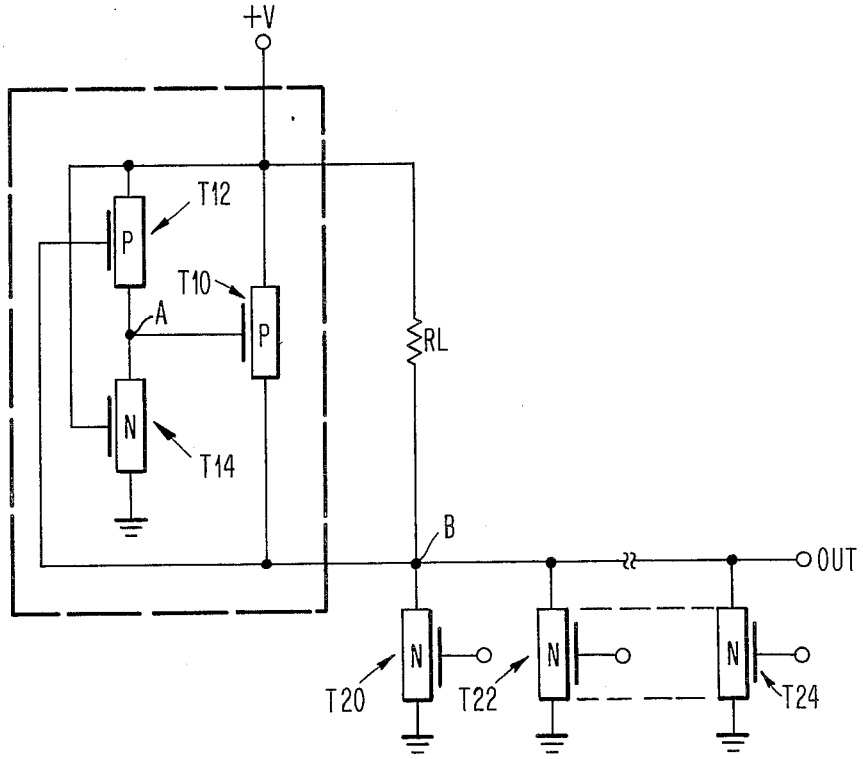
Figure 3A:
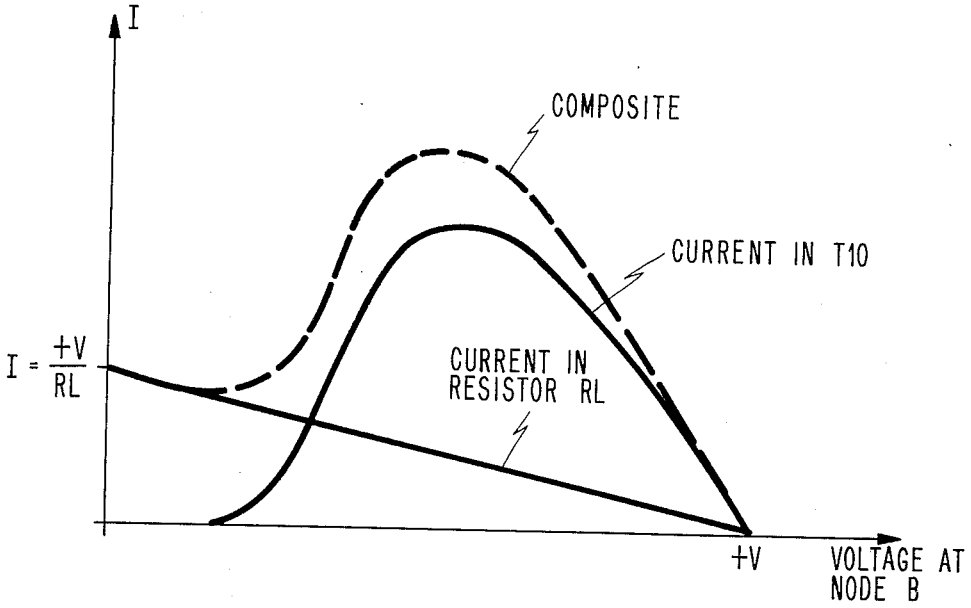
Figure 3B:
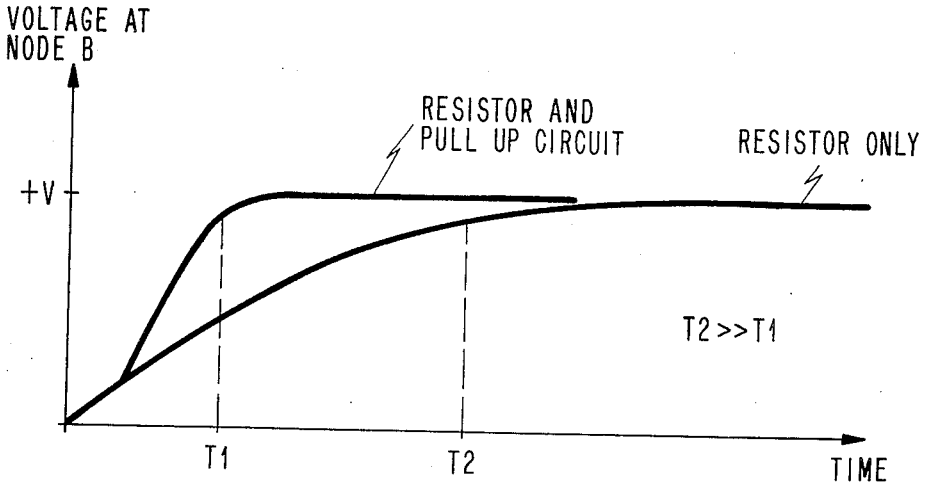

DEFENSIVE PUBLICATION

UNITED STATES PATENT AND TRADEMARK OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent and Trademark Office makes no assertion as to the novelty of the disclosed subject matter.

PUBLISHED NOVEMBER 2, 1976

952 O.G. 10

T952,012

VARIABLE IMPEDANCE PULL-UP DRIVER

James M. Lee, Poughkeepsie, N.Y., assignor to International Business Machines Corporation, Armonk, N.Y.

Continuation of abandoned application Ser. No. 483,510, June 27, 1974. This application Jan. 20, 1976, Ser. No. 650,812

Int. Cl.[2] H03K *17/04, 19/08, 19/34, 19/40*

U.S. Cl. 307—205

2 Sheets Drawing. 9 Pages Specification

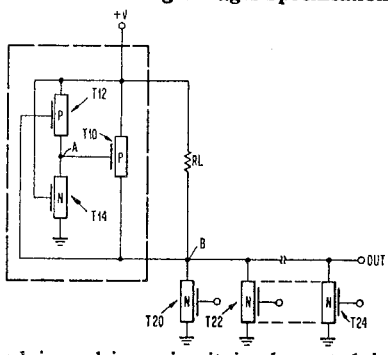

Disclosed is a driver circuit implemented in complementary field effect transistor (CFET) technology for improving the transient response of CFET circuits and providing a true DOT-OR logic function. The pull-up circuit includes an inverter (transistors T12 and T14) and a pull-up transistor T10 placed in parallel with the conventional load impedance RL between a source of potential +V and the output node.